United States Patent [19]

Lesk

[11] 4,026,736
[45] May 31, 1977

[54] INTEGRATED SEMICONDUCTOR STRUCTURE WITH COMBINED DIELECTRIC AND PN JUNCTION ISOLATION INCLUDING FABRICATION METHOD THEREFOR

[75] Inventor: Israel Arnold Lesk, Scottsdale, Ariz.

[73] Assignee: Motorola, Inc., Chicago, Ill.

[22] Filed: July 18, 1975

[21] Appl. No.: 596,946

Related U.S. Application Data

[62] Division of Ser. No. 430,433, Jan. 3, 1974, abandoned.

[52] U.S. Cl. .............................. 148/187; 148/175
[51] Int. Cl.[2] ....................................... H01L 21/20
[58] Field of Search ........................ 148/187, 175

[56] References Cited

UNITED STATES PATENTS

| 3,769,562 | 10/1973 | Bean | 148/175 UX |
| 3,783,044 | 1/1974 | Cheskis et al. | 148/175 |
| 3,798,753 | 3/1974 | Camenzind et al. | 148/175 UX |
| 3,878,552 | 4/1975 | Rodgers | 148/175 X |
| 3,913,124 | 10/1975 | Roberson | 148/175 |

*Primary Examiner*—L. Dewayne Rutledge
*Assistant Examiner*—J. M. Davis
*Attorney, Agent, or Firm*—Lowell E. Clark

[57] ABSTRACT

This disclosure is directed to an integrated semiconductor structure with combined dielectric and PN junction isolation including the fabrication method therefor wherein a compensating P type channel is formed adjacent to the dielectric side isolation across one end portion of the electrically isolated N type collector region as well as around the bottom portion of the dielectric side isolation material or layer in order to overcome the N channel inversion (in P type semiconductor material) that is formed when the dielectric isolation material is silicon dioxide. The disclosed structure is an NPN transistor device having a buried sub-collector region of N+ type conductivity and further includes a P type substrate thereby providing a PN junction isolating substrate. The silicon dioxide material or layer is used to electrically isolate the side portions of the NPN transistor device from adjacent devices. The side dielectric isolation region is formed in a substantially V-shaped configuration with polycrystalline silicon forming the material located within the dielectric V-shaped member thereby providing a substantially planar surface for the integrated semiconductor structure.

5 Claims, 2 Drawing Figures

INTEGRATED SEMICONDUCTOR STRUCTURE WITH COMBINED DIELECTRIC AND PN JUNCTION ISOLATION INCLUDING FABRICATION METHOD THEREFOR

This is a division, of application Ser. No. 430,433, filed Jan. 3, 1974, now abandoned.

BACKGROUND OF THE INVENTION

1. Field of the Invention

This invention relates generally to integrated semiconductor structures including fabrication methods therefor and, more particularly, to integrated NPN semiconductor transistor structures using PN junction substrate isolation and dielectric sidewall isolation including the fabrication methods therefor.

2. Background of the Prior Art

In the past, integrated semiconductor structures were fabricated using PN junction isolation in order to electrically isolate various transistor or other devices (diodes, resistors, etc.) from each other. The PN junction isolated devices usually had a substrate of one type conductivity and the device having a collector or other region of opposite type conductivity was located on the substrate and biased with respect to the substrate in a manner to utilize the PN junction between the substrate and the device for electrically isolating the device from the substrate.

Other techniques for isolating devices in an integrated semiconductor substrate were developed including the concept of dielectric isolation. In this technique of isolation, the various semiconductor devices were formed in monocrystalline pockets of semiconductor material which were isolated from a substrate by means of a dielectric material, usually silicon dioxide. The dielectric isolated devices have an advantage over junction isolated devices in the elimination of the bias needed to set up the PN junction isolation and also in the avoidance of the possible breakdown of the PN junction.

Combinations of PN junction isolated structures and dielectric isolated regions were utilized to provide integrated semiconductor structures using the benefits of both isolation techniques. The advantage of the PN junction isolated structure is that it can be generally made more planar and with less fabrication steps than the more complex dielectric substrate isolated devices.

One recently developed technique used in the combination of PN junction and dielectric isolated structures produced the "VIP" semiconductor structure wherein a V-shaped moat which was formed around the individual transistor devices was subsequently filled by means of a V-shaped silicon dioxide isolation layer followed by a filled-in Polycrystalline silicon semiconductor material which thereby formed the "VIP" isolation channel.

However, in designing and utilizing the "VIP" integrated semiconductor structures, it was discovered that leakage paths developed between supposedly electrically isolated semiconductor devices thereby destroying their electrical isolation and resulted in the breakdown of the usefulness of the integrated circuit. Accordingly, a need existed to develop a new type of "VIP" semiconductor structure which would have higher reliability and avoid the problems of leakage and the resultant breakdown of the electrical isolation features of the integrated semiconductor structure.

SUMMARY OF THE INVENTION

It is an object of this invention to provide an improved integrated semiconductor structure including fabrication method therefor.

It is another object of this invention to provide an improved "VIP" integrated semiconductor structure including fabrication method therefor.

It is a still further object of this invention to provide a "VIP" integrated semiconductor structure utilizing NPN semiconductor devices including fabrication method therefor.

DESCRIPTION OF THE SPECIFICATION

Figure 1:
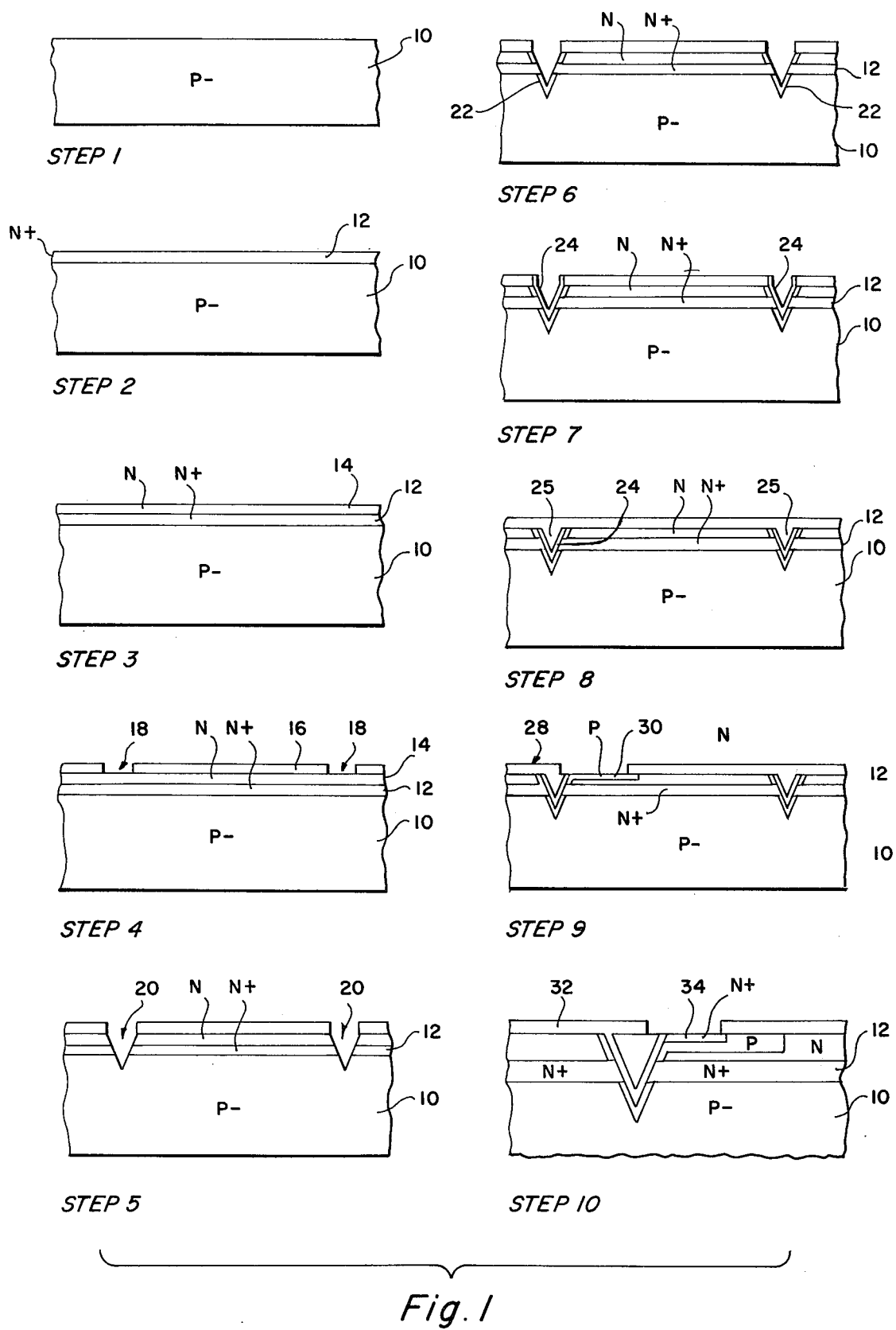
FIG. 1 illustrates in ten different steps which are shown in elevational cross sectional view the fabrication process for making a "VIP" integrated semiconductor structure using NPN semiconductor transistor devices.

Referring to FIG. 1, Step 1 illustrates a P— substrate 10 which has been formed by conventional semiconductor wafer fabrication techniques which may include Czochralski pulling of a rod and subsequent slicing and polishing of wafers from the original rod of P— type conductivity.

In Step 2, an N+ layer 12 is shown preferably epitaxially grown on the P— substrate 10. If desired, the N+ layer 12 can be formed by ion implantation or diffusion techniques. While the P— substrate region 10 contains a P type dopant such as boron, the N+ layer 12 contains N type dopants such as phosphorous arsenic.

In Step 3, an N type layer 14 is formed on the N+ layer 12, preferably by epitaxial growth techniques.

In Step 4, an insulating masking layer 16 is formed on the surface of the N type layer 14. The insulating masking layer 16 is preferably made of silicon dioxide which is thermally grown or deposited on the surface of the N type layer 14. Following the thermal growth or other deposition techniques used to form the silicon dioxide insulating layer 16, a surrounding moat shaped opening 18 is formed in the silicon dioxide masking layer 16 by means of conventional photolithographic masking and etching techniques.

In Step 5, a V-shaped moat is formed through the N type layer 14, N+ layer 12 and into the P— substrate 10 as shown in this figure. The original P— substrate 10 has a 100 crystallographic surface orientation so that the surface of the N type layer 14 has the same crystallographic orientation. However, the faces of the circumferential groove formed in the moat 20 in Step 5 have a 111 crystallographic orientation due to the use of an anisotropic etch which etches faster in the 100 direction and more slowly in the 111 direction thereby resulting in the slanted wall 111 crystallographic face formation for the moat 20.

In Step 6, a P type diffusion or ion implantation operation is carried out to form the P type channel 22 shown in the P— substrate 10 and also shown across the N type collector layer 14. The P type channel 22 does not extend across the N+ sub-collector region 12 due to the heavy concentration of N type impurities in the N+ region 12. As a result, the P type channel 22 in the P— substrate region 10 serves to prevent inversion of this region during the subsequent formation of a silicon dioxide dielectric isolation material in the V-shaped channel or moat 20. This is extremely critical in the process and serves to prevent leakage paths from being formed between electrically isolated semiconductor devices which would otherwise be formed around the bottom of the "VIP" moat formed surrounding the individual transistor or semiconductor devices. Additionally, the P type channel 22 also serves to prevent shorting between the subsequently formed emitter region and the collector region 14.

In Step 7, a dielectric isolation material is deposited or formed in the moat 20 as shown by layer 24. Preferably, layer 24 is made of silicon dioxide which is deposited or grown by conventional thermal growth techniques in the moat 20. As can be seen with reference to Step 7 of FIG. 1, the dielectric isolation silicon dioxide material 24 serves to dielectrically isolate the side portions of the individual semiconductor region located within the circumferential moat 20. In this manner, the combination of the dielectric isolation material 24 and the PN junction formed (a) between the P− substrate 10 and the N+ sub-collector region 12 and (b) between the P diffused region 22 and the N+ sub-collector region 12 serves to provide combined dielectric and PN junction isolation for the semiconductor regions located within the circumferential moat 20. Alternatively, the use of a silicon dioxide layer combined with aluminum oxide covering layer will serve to compensate for the N type channel in the P type regions in contact with the silicon dioxide layer that is generally induced by the use of a silicon dioxide layer 24 alone. In this latter example, it may not be necessary to carry out a P type diffusion to form the P type channel 22 as shown in Step 6 of FIG. 1.

In Step 8, in order to complete the planarity of the semiconductor structure shown in this figure, a polycrystalline silicon deposition process is carried out to fill in the moat 20 and supply a filler of polycrystalline silicon material 25 which is compatible with the remainder of the semiconductor substrate as far as coefficients of expansion, etc. The surface of the structure depicted in Step 8 is shown after being subjected to etching or mechanical lapping techniques to achieve the desired planarity down to the original surface of the semiconductor structure.

In Step 9, another masking layer 28, preferably of silicon dioxide, is formed to cover the entire upper surface of the structure and an opening is subsequently formed therein to permit the creation of a P type region 30 by means of conventional diffusion techniques. If desired, ion implantation techniques can be utilized as an alternative to the conventional diffusion technique. The P type region 30 is a boron doped region, preferably.

In Step 10, a new masking layer 32 is formed on the surface of a semiconductor structure and by means of conventional photolithographic masking and etching techniques, another opening is formed in the silicon dioxide masking layer 32 to permit the formation of an N+ region 34 which subsequently serves as the emitter region for the NPN transistor device. Either diffusion or ion implantation techniques can be utilized to form the N+ region 34 using the opening in the insulating masking layer 32. As can be seen with reference to Step 9 and Step 10, the P type region 30 has one of its sides terminating into the side dielectric layer 24. Similarly, the N+ emitter region 34 has one of its sides terminating into the side dielectric layer 24 (see Step 10). Hence, the NPN transistor device shown in Step 10 with the N+ emitter region and the P type base region shown terminated into the side dielectric isolation layer 24 provides a very highly dense integrated semiconductor structure to be formed without loss of semiconductor "real estate" which occur if the emitter and base regions were located away from the side dielectric layer 24.

Figure 2:
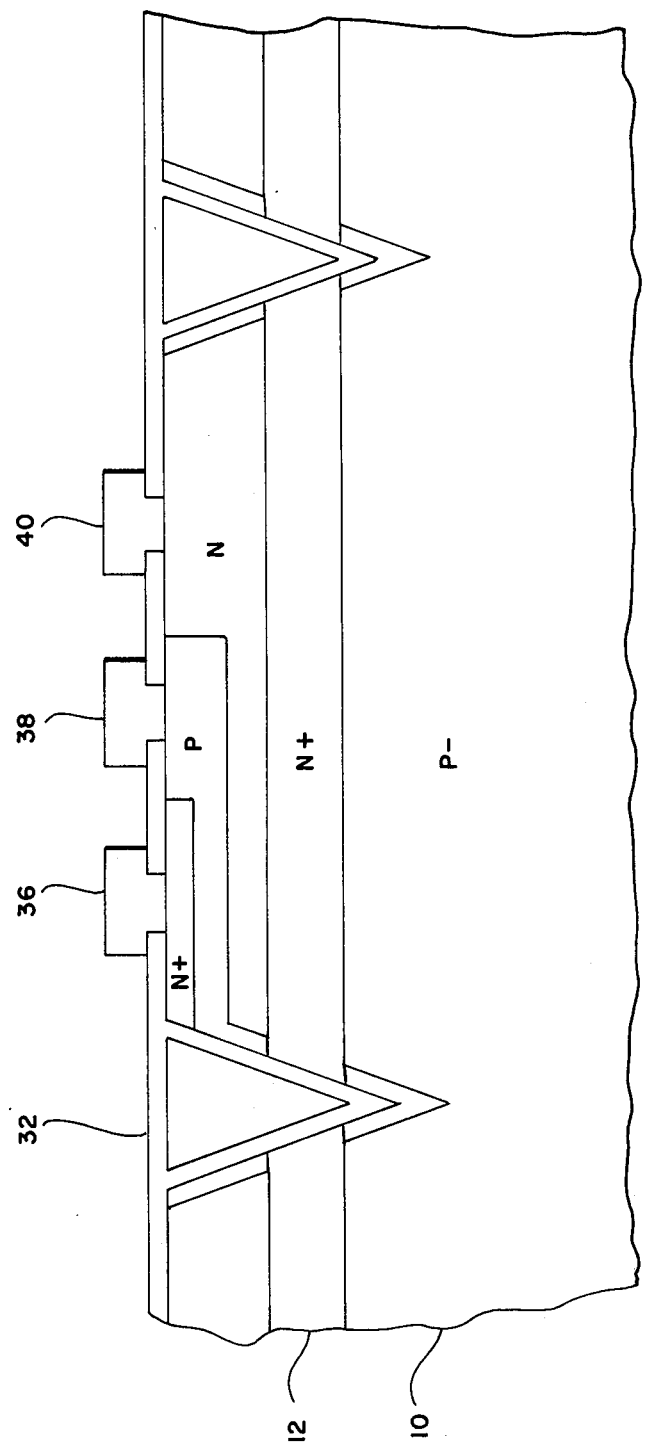
FIG. 2 is a view similar to the view shown in Step 10 of FIG. 1 with the metal contacts shown to the various regions of the NPN transistor device.

Referring to FIG. 2, this figure illustrates the final integrated semiconductor structure (shown in Step 10) having a final insulating ($SiO_2$) layer 32 with emitter metal contact 36, base metal contact 38 and collector metal contact 40 provided in the insulating layer 32.

While the invention has been particularly shown and described in reference to the preferred embodiments thereof, it will be understood by those skilled in the art that changes in form and details may be made therein without departing from the spirit and scope of the invention.

What is claimed is:

1. A method for fabricating an integrated semiconductor structure comprising the steps of:
   forming a region of N+-type conductivity on a semiconductor substrate of P-type conductivity;
   epitaxially growing a region of N-type conductivity on said region of N+-type conductivity;
   etching at least one moat through said N+ and N−-type regions into said P-type semiconductor substrate surrounding a region of semiconductor material containing said N+ and N-type regions;
   forming at least one region of P-type conductivity in said N-type conductivity region adjacent said moat;
   forming a second region of N+-type conductivity in said P-type conductivity region adjacent said moat;
   forming a P-type channel in said P-type substrate and said N-type region adjacent to said moat; and
   filling in said moat with material having a coefficient of thermal expansion similar to the coefficient of thermal expansion of said semiconductor substrate.
2. The method of claim 1, where the etching of said moat comprises anisotropic etching of a V-shaped moat.
3. The method of claim 1 including the step of filling the moat with polycrystalline silicon.
4. A method in accordance with claim 3 further including the step of forming a silicon dioxide layer in the moat prior to filling the moat with polycrystalline silicon.
5. The method of claim 1, including the step of diffusing or ion implanting said P-type channel prior to the step of filling said moat.

* * * * *